(12) United States Patent
Bittner et al.

(10) Patent No.: US 9,235,143 B2
(45) Date of Patent: Jan. 12, 2016

(54) MICROLITHOGRAPHIC PROJECTION EXPOSURE APPARATUS

(75) Inventors: Boris Bittner, Roth (DE); Norbert Wabra, Werneck (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 631 days.

(21) Appl. No.: 13/613,486

(22) Filed: Sep. 13, 2012

(65) Prior Publication Data

US 2013/0070221 A1 Mar. 21, 2013

(30) Foreign Application Priority Data

Sep. 15, 2011 (DE) .......... 10 2011 113 521

(51) Int. Cl.
*G03B 27/42* (2006.01)
*G03B 27/52* (2006.01)
*G03B 27/58* (2006.01)
*G03F 7/20* (2006.01)

(52) U.S. Cl.
CPC .......... *G03F 7/70883* (2013.01); *G03F 7/7005* (2013.01)

(58) Field of Classification Search
CPC ............ G03F 7/70308; G03F 7/70275; G03F 7/7005; G03F 7/70191; G03F 7/70125; G03F 7/201; G03F 7/70991; G03F 7/70058; G03F 7/70433; G02B 7/028; G02B 27/0068; G02B 27/0927; G02B 27/0988; G02B 27/62; G02B 7/008; G02B 7/181
See application file for complete search history.

(56) References Cited

U.S. PATENT DOCUMENTS

| 7,372,623 | B2 | 5/2008 | Banine et al. |
| 7,477,355 | B2 | 1/2009 | Fehr et al. |
| 7,557,902 | B2 | 7/2009 | Dinger et al. |
| 2005/0018269 | A1* | 1/2005 | Weiss et al. .................... 359/212 |
| 2006/0098210 | A1* | 5/2006 | Freimann et al. ............. 356/521 |
| 2006/0098273 | A1* | 5/2006 | Takahashi ..................... 359/365 |
| 2009/0219500 | A1* | 9/2009 | Tel et al. .......................... 355/67 |

FOREIGN PATENT DOCUMENTS

| DE | 103 17 662 | 11/2004 |
| WO | WO 2004/092843 | 10/2004 |

\* cited by examiner

*Primary Examiner* — Mesfin T Asfaw
(74) *Attorney, Agent, or Firm* — Fish & Richardson P.C.

(57) ABSTRACT

A microlithographic projection exposure apparatus includes a projection light source, a heating light source, a catoptric projection lens and a reflecting switching element, which can be arranged outside of the projection lens and can be displaced between a first position and a second position via a drive. Only the projection light can enter the projection lens in the first position of the switching element, and only the heating light can enter the projection lens in the second position of the switching element.

20 Claims, 11 Drawing Sheets

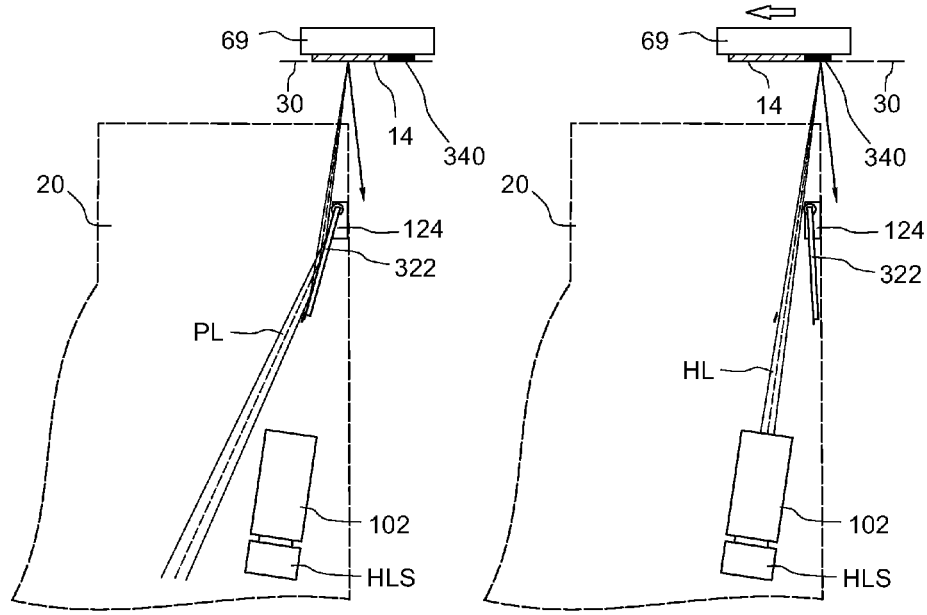
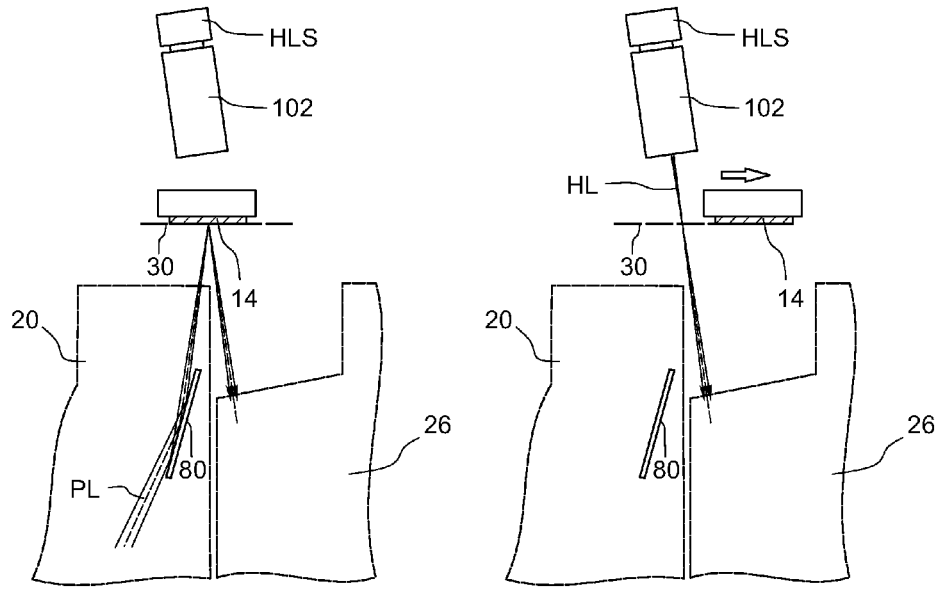
Fig. 12   Fig. 13
Fig. 14   Fig. 15

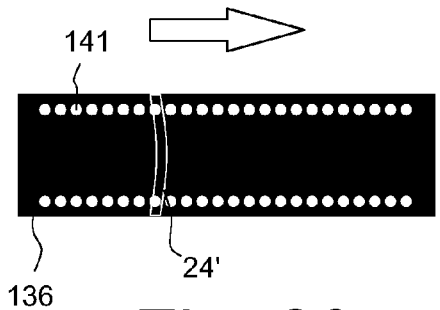
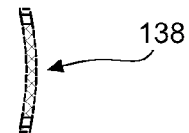
Fig. 20  Fig. 21
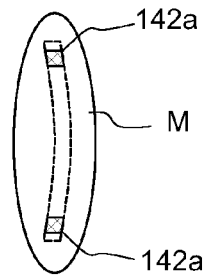
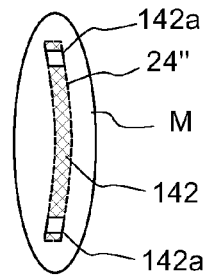
Fig. 22  Fig. 23
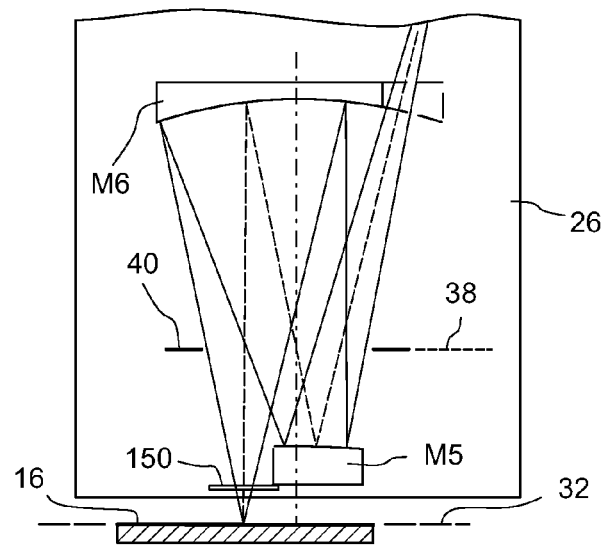
Fig. 25

MICROLITHOGRAPHIC PROJECTION EXPOSURE APPARATUS

CROSS-REFERENCE TO RELATED APPLICATIONS

This application claims priority under 35 U.S.C. §119 to German Application No. 10 2011 113 521.2, filed Sep. 15, 2011. The contents of where are hereby incorporated by reference in their entirety.

FIELD

The disclosure relates to a microlithographic projection exposure apparatus for imaging a mask on a layer using a catoptric projection lens, which, in particular, is configured for wavelengths in the extreme ultraviolet spectral range (EUV).

BACKGROUND

Microlithographic projection exposure apparatuses are used to transfer structures which are contained in a mask or arranged thereon to a resist or another light-sensitive layer. Optical components of a projection exposure apparatus include a light source, an illumination system which prepares projection light generated by the light source and directs it onto the mask, and a projection lens, which images the region of the mask illuminated by the illumination system onto the light-sensitive layer.

In general, the shorter the wavelength of the projection light is, the smaller the structures are that can be defined on the light-sensitive layer with the aid of the projection exposure apparatus. The most recent generation of projection exposure apparatuses uses projection light with a mean wavelength of approximately 13.5 nm, which therefore is situated in the extreme ultraviolet spectral range (EUV). Such apparatuses are often referred to as EUV projection exposure apparatuses for short.

However, generally, there are no optical materials which have a sufficiently high transmissivity for such short wavelengths. Thus, the lenses and other refractive optical elements, which are conventional at longer wavelengths, have been replaced by mirrors in EUV projection exposure apparatuses, and the mask too therefore contains a pattern of reflecting structures.

The provision of mirrors for EUV projection exposure apparatuses can be a great technological challenge. Coatings that are suitable for EUV light and applied to a mirror substrate often include more than 30 or 40 double layers with a thickness of only a few nanometers, which are applied onto one another by vapor deposition in technologically complex processes. Even in the case of coatings with such a complex design, the reflectivity of the mirrors for the EUV light is usually hardly more than 70%, and, in general, this also only holds for light that impinges perpendicularly onto the reflective coating or with angles of incidence of a few degrees.

The upshot of the comparatively low reflectivity of the mirrors is that an effort has been made during the development of projection exposure apparatuses to use as few mirrors as possible because each mirror means a loss of light and ultimately reduces the throughput of the projection exposure apparatus.

However, the relatively low reflectivity of the mirrors is often also accompanied by thermal issues because the portion of the energy-rich EUV light that is not reflected by the coating can be absorbed and lead to a temperature increase in the mirrors. In general, the heat generated in the process is substantially dissipated by thermal conduction via the mirror substrate because projection exposure apparatuses are usually operated in a vacuum on account of the high absorption of EUV light by gasses and therefore convective heat dissipation by gas cooling is ruled out.

So that occurring temperature gradients in the mirror substrates do not lead to an undesired deformation of the mirrors, the use of materials which have a small (even vanishingly small) thermal expansion coefficient at the operating temperature is often favored for the mirror substrates. Such glass-based materials are distributed by e.g. Schott under the branding Zerodur® and by Corning under the branding ULE®. As a result of additional measures, thermal deformations which are caused by EUV light absorption can be kept low or at least the effects thereof on the optical properties of the projection lens can be kept within tolerable limits.

Thus, U.S. Pat. No. 7,477,355 B2 proposes to heat mirrors with the aid of an additional heating mechanism such that a temperature is set in the substrate material of the mirrors at which the thermal expansion coefficient equals zero or at least is minimal. Temperature variations during the operation of the apparatus then have no effect, or only a small effect, on the imaging properties of the mirror.

U.S. Pat. No. 7,557,902 B2 describes a projection lens in which two mirrors contain materials, the thermal expansion coefficient of which increases with increasing temperature in one of the two mirrors and decreases with increasing temperature in the other mirror. What this can achieve in the case of a suitable selection of the mirrors is that although the two mirrors significantly deform in the case of a temperature change, the optical effects of these deformations largely cancel out one another.

DE 103 17 662 A1 discloses an EUV projection exposure apparatus with a heating light source, which illuminates selected regions on imaging mirrors with additional heating light. The absorption of the heating light leads to an at least approximately homogeneous temperature distribution on the surface of the mirror. Here, a suitable configuration makes it possible to achieve a temperature set in thermal equilibrium, at which the thermal expansion coefficient of the mirror substrate has a minimum value. As a result, relatively small temperature variations or remaining inhomogeneities in the temperature distribution can no longer lead to noteworthy thermal deformations of the mirror substrate, and hence to aberrations.

In order only to illuminate selected regions on the mirror with the heating light, a transmission filter is arranged behind the heating light source of this known projection exposure apparatus, the filter shadowing those regions on the mirror surface on which projection light is incident and which should therefore not be additionally heated by heating light. If the heating light should form a pattern with as sharp edges as possible on the mirror surface, provision can be made for an additional imaging optical system which images the transmission filter onto the mirror surface. In another exemplary embodiment, a laser which is associated with a controllable ray-deflection device is used as heating light source. This ray-deflection device is used to direct the laser ray generated by the laser onto the desired regions on the mirror surface only. The ray-deflection device can in this case include rotating mirrors, as are contained in a similar fashion in barcode scanners which are known.

A disadvantage of this known projection exposure apparatus can be that when a plurality of mirrors are illuminated with heating light, a heating light source and optical components are provided for each of these mirrors. These components are arranged such that they direct the heating light onto the respective mirror at an angle of incidence that is not too shallow. However, there often is not enough installation space available in the projection lens for such optical components and also for the heating light sources.

SUMMARY

The disclosure provides a projection exposure apparatus with one or more imaging mirrors that can be heated locally by additional heating light using few additional components.

In one aspect, the disclosure provides a microlithographic projection exposure apparatus for imaging a reflecting mask onto a layer, having a projection light source, which is configured to generate projection light having a first mean wavelength. Provision is furthermore made for a heating light source, which differs from the projection light source and is configured to generate heating light having a second mean wavelength that differs from the first mean wavelength. The projection exposure apparatus moreover includes a catoptric projection lens with a plurality of imaging mirrors. The projection lens has an object plane, in which the mask can be arranged, and an image plane, in which the layer can be arranged. The projection exposure apparatus also has a reflecting switching element, preferably arranged outside of the projection lens, and a drive, which is configured to displace the switching element between a first position and a second position. Only the projection light can enter the projection lens in the first position of the switching element, and only the heating light can enter the projection lens in the second position of the switching element.

Hence the heating light is coupled into the projection lens from the outside. In general, the coupling in this case is undertaken from the object plane of the projection lens. However, in principle, coupling from the image plane can also be considered, in which image plane the layer is situated during the projection operation.

With the aid of the switching element provided with a drive, the heating light can enter the projection lens just like the projection light and can therefore follow the beam path thereof. As a result of this, it is possible, in turn, to use the heating light to heat not just one but rather a plurality of imaging mirrors in the projection lens in a targeted fashion. However, the disclosure can also be used advantageously in the case of projection lenses in which only a single imaging mirror, e.g. the first one in the beam path, should be heated locally by heating light.

The switching element therefore can enable the process of coupling the heating light into the beam path of the projection light. As a secondary effect, the switching element can, in the case of a suitable design, ensure that no heating light can enter the projection lens during the projection operation and that no projection light can enter the projection lens during the heating operation. However, in general the projection light source and the heating source will be actuated such that no heating light is generated during the projection operation and that no projection light is generated during the heating operation.

In general, the projection exposure apparatus includes a catoptric projection-light illumination system, which is configured to direct projection light generated by the projection light source onto the mask when the switching element is situated in the first position.

The switching element can then be arranged between the projection light source and the projection-light illumination system such that the heating light completely passes through the projection-light illumination system prior to entering the projection lens. In this case, the switching element preferably only reflects the projection light in the second position, but not in the first position. Using a switching element arranged thus, it is possible, with the aid of the projection-light illumination system, to modify the illumination angle distribution of the heating light in the object plane of the projection lens in the same manner as is also possible for the projection light. A change in the illumination angle distribution during the heating operation is used in particular if the heating light should generate a different intensity distribution on imaging mirrors arranged near the pupil than occurs during the projection operation. Hence, in the case of such an arrangement of the switching element there is no need to take further measures in order to apply a desired illumination angle distribution to the heating light.

However, the switching element can also be arranged between the projection light source and the projection-light illumination system such that the heating light only partly passes through the projection-light illumination system prior to entering the projection lens. Since the heating light then only uses the projection illumination system in part, it may be desirable to assign additional optical components to the heating light source. Furthermore, the switching element can in this case be one of the illumination mirrors which are in any case contained in the projection-light illumination system. In this case, the switching element reflects the projection light only in the first position, but not in the second position.

The switching element can furthermore be arranged between the illumination system and the projection lens such that the heating light enters the projection lens without having previously passed through the projection-light illumination system. The heating light then enters the projection lens directly after e.g. a reflection on the mask or another reflecting element (e.g. a planar deflection mirror) arranged in the object plane.

However, in this case the switching element can also be the mask itself which, in the second position, is arranged such that the heating light enters the projection lens without reflection on the mask. This is how the additional complexity for a switching element and a drive associated with the switching element is dispensed with.

In order to make better use of the available installation space, it may be expedient to form the switching element by the mask and a deflection element, with the mask and the deflection element being arranged in the first position such that the projection light enters the projection lens after being reflected by the mask, but without being reflected by the deflection element. By contrast, in the second position, the mask and the deflection element are arranged such that the heating light enters the projection lens without being reflected by the mask, but after being reflected by the deflection element. Here, the deflection element can, together with the mask, be arranged in displaceable fashion on a mask displacement table. This embodiment also dispenses with the complexity of an additional switching element and a drive for the latter.

When the switching element is arranged in the projection-light illumination system or between the projection-light illumination system and the projection lens, it is expedient for the projection exposure apparatus to include a heating-light illumination system, which has an adjustment device that is configured to change an illumination angle distribution which the heating light has in the object plane of the projection lens. This is because if the heating light is only coupled into the beam path in or behind the projection-light illumination system, the optical components thereof cannot be used to apply the desired illumination angle distribution to the heating light. Should the illumination angle distribution of the heating light be variably adaptable to the illumination angle distribution of the projection light during the projection operation, an independent heating-light illumination system assumes this object. However, the latter can have a relatively simple design because, unlike in the case of the illumination of the mask with projection light, there are not the very high demands with respect to the accuracy with which the illumination angle distribution and the intensity of the heating light are to be generated in the object plane of the projection lens.

By way of example, the adjustment device can include an LCD matrix or other optical components, which are arranged in a pupil surface of the heating-light illumination system and by which the intensity distribution in the pupil surface can be modified in a variable fashion. Replaceable diffractive optical elements or micromirror arrays are also suitable to this end, by which the pupil surface can be illuminated in a variable fashion. The intensity distribution on the pupil surface of the heating-light illumination system is then imaged on imaging mirrors, arranged near the pupil, of the projection lens by the following optical components, as a result of which the desired homogenization of the temperature distribution is achieved at the place.

A control unit can control the projection light source, the heating light source and the switching element such that heating light can only enter the projection lens during time intervals during which a substrate, which carries the layer, is being replaced by another substrate. These time intervals, which are also referred to as duty cycles, are long enough to displace the switching element from the first into the second position and back to the first position after completing the heating operation. Although these time intervals overall are relatively short compared to the projection operation, this can be compensated for by the use of powerful heating light sources. Hence, the desired uniform heat influx can be obtained averaged over time over the optically useable area of the relevant imaging mirrors.

However, it is also conceivable to use the shorter times between two successive scanning processes for a heating operation.

The control unit can control the projection light source, the heating light source and the switching element, as well as—depending on the type of embodiment—the projection-light illumination system or the heating-light illumination system such that the heating light only impinges on regions on the imaging mirror on which no projection light impinged during a preceding projection operation. As a result, the desired homogenization of the temperature distribution is achieved on the relevant imaging mirrors. However, under certain circumstances it may also be expedient for the regions illuminated by projection light and by heating light have a small overlap. By way of example, this is conceivable if the regions illuminated by the projection light or heating light are not sharply delimited but rather have a slowly decreasing intensity toward the edges of these regions.

Since the wafer covered with the light-sensitive layer may possibly still be situated in the field of view of the projection lens during the heating operation, it may be expedient if a shutter is arranged in the projection lens or between the projection lens and the layer, which shutter absorbs or reflects the heating light in a closed position to such a complete extent that only little, specifically less than 5%, preferably less than 0.5%, of the heating light generated by the heating light source can impinge on the layer. As a result, heating light cannot significantly contribute to an exposure during the heating operation. Although the layers are primarily only sensitive to the wavelength for which the projection exposure apparatus was designed, high intensities in other spectral ranges can, in certain circumstances, likewise lead to the exposure threshold of the layer being exceeded.

Instead of a shutter, a filter element can be arranged in the projection lens or between the projection lens and the layer, which filter element is transparent to the projection light and opaque to the heating light. As a result, there no longer is the need to actuate a shutter during each change between projection operation and heating operation. Just like in the case of the shutter, it is also true in this case that the filter element should where possible be arranged in the optical beam path behind the imaging mirrors of the projection lens so that the heating light can reach all imaging mirrors.

The second mean wavelength is preferably greater than the first mean wavelength. As a result, it is possible to use comparatively cost-effective heating light sources such as excimer lasers for example. In particular, the first mean wavelength can be less than 50 nm and the second mean wavelength can be greater than 150 nm. In the case of other exemplary embodiments, the first mean wavelength is less than 20 nm and the second mean wavelength is greater than 200 nm.

In one aspect, the disclosure provides a method, which includes:
 a) providing a projection light source, which is configured to generate projection light;
 b) providing a heating light source, which differs from the projection light source and is configured to generate heating light, which differs from the projection light;
 c) illuminating a mask with the projection light;
 d) imaging the mask on a layer with the aid of a catoptric projection lens containing a plurality of imaging mirrors, wherein a reflecting switching element is situated in a first position, in which only the projection light and not the heating light can enter the projection lens;
 e) displacing the switching element into a second position, in which only the heating light and not the projection light can enter the projection lens;
 f) directing the heating light onto the projection lens such that the heating light enters the projection lens.

The displacement of the switching element between the first and the second position therefore enables alternating entry of projection light and heating light into the projection lens. The heating light preferably substantially follows the beam path of the projection light, as a result of which the heating light can impinge on all imaging mirrors of the projection lens. In respect of the further advantages and embodiments, reference is made, in a supplemental fashion, to the explanations above in respect of the projection exposure apparatus according to the disclosure.

The heating light can enter the projection lens during time intervals in which a substrate, which carries the layer, is being replaced by another substrate.

As an alternative to this, if the mask is displaced within a scanning process during d), it is possible for the heating light to enter the projection lens between two successive scanning processes.

In some exemplary embodiments, the heating light only impinges on regions on the imaging mirrors on which no projection light impinged during d).

The illumination angle distribution of the heating light in the object plane of the projection lens can be adapted to the illumination angle distribution of the projection light in the object plane of the projection lens. In particular, this adaptation can be undertaken in such a way that the illumination angle distribution of the heating light in the object plane of the projection lens is adapted such that it is at least substantially complementary to the illumination angle distribution of the projection light in the object plane of the projection lens.

In order also to be able to homogenize the temperature distribution of imaging mirrors arranged near the field, a second mask can be imaged during f), the second mask differing from the mask which is imaged during d). During the heating operation, the second mask illuminates those regions on the imaging mirror arranged near the field with the heating light which have to be heated in order to homogenize the temperature distribution.

In another exemplary embodiment, the second mask has a region with an area, at least 90% of which reflects at least 90% of the heating light. Here, the region which can, in particular, be a plane mirror, covers the whole object field of the projection lens that can be projected onto the layer. If the heating light impinges on this region during the heating operation, almost all of the heating light is coupled into the projection lens. At the same time, the heating light is prevented from heating that part of the mask which is imaged on the layer during the projection operation.

The switching element can be designed and arranged in the projection exposure apparatus in such a way that it reflects the projection light in the first position and does not reflect the projection light in the second position. However, embodiments and arrangements of the switching element are also possible in which this is reversed, i.e. the projection light is not reflected in the first position and is reflected in the second position.

Generally, it will be expedient for the heating light to be directed onto the projection lens in such a way that it also impinges on a last imaging mirror of the projection lens on the image side. This allows all imaging mirrors of the projection lens to be locally heated by the heating light.

As a result of using a filter element or a shutter it is possible to ensure that little, to be precise less than 5%, preferably less than 0.5%, of the heating light generated by the heating light source impinges on the layer. The heating light source is preferably actuated such that it only generates heating light once the shutter is in its closed position and thereby ensures that little, to be precise less than 5%, preferably less than 0.5%, of the heating light generated by the heating light source impinges on the layer.

BRIEF DESCRIPTION OF THE DRAWINGS

Further features and advantages of the disclosure emerge from the following description of exemplary embodiments on the basis of the drawings, which are all schematic and not to scale, and in which:

FIGS. 12 and 13 show, in sections, meridional sections through a projection-light illumination system during the projection operation and the heating operation, respectively, as per another exemplary embodiment in which the switching mirror reflects projection light during the projection operation;

FIGS. 14 and 15 show, in sections, meridional sections through a projection exposure apparatus during the projection operation and the heating operation, respectively, as per a further exemplary embodiment in which the mask itself forms a switching element;

FIG. 20 shows the image of the first mask in the image plane of the projection lens, as generated by the projection light during a whole scanning process;

FIG. 21 shows the image of the second mask in the image plane of the projection lens, as generated by the heating light during stationary imaging;

FIG. 22 shows a plan view of an imaging mirror, arranged near the field, with an intensity distribution generated by the projection light;

FIG. 23 shows a plan view of the imaging mirror, arranged near the field, from FIG. 22 with an intensity distribution generated by the heating light;

FIG. 25 shows the end region of a projection lens, in which a filter element, which is transparent to heating light, is arranged in the beam path in place of a shutter;

DESCRIPTION OF PREFERRED EXEMPLARY EMBODIMENTS

1. Basic Design of the Projection Exposure Apparatus

Figure 1:
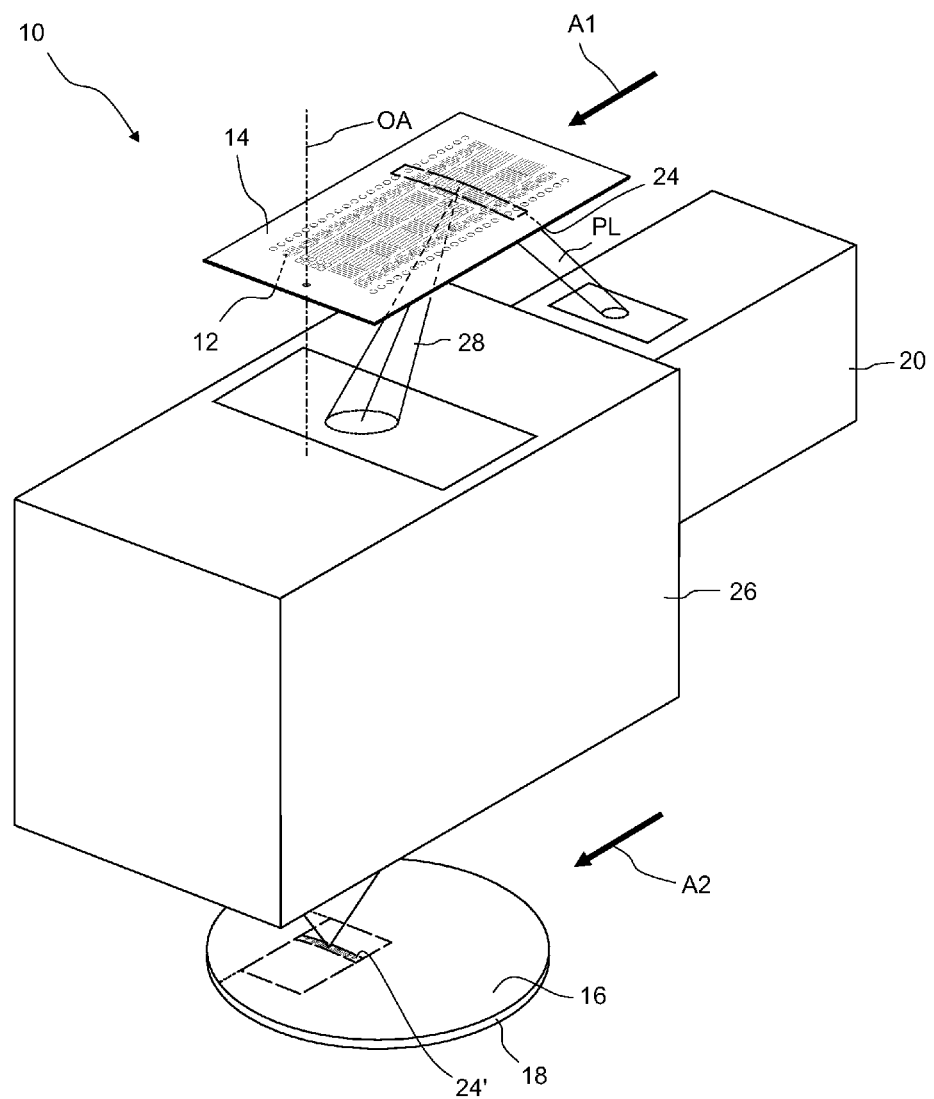
FIG. 1 shows a perspective view of an EUV projection exposure apparatus according to a first embodiment the disclosure.

In a perspective and very schematic illustration, FIG. 1 shows the basic design of a microlithographic projection exposure apparatus according to the disclosure, which is denoted by 10 in its entirety. The projection exposure apparatus 10 serves to project reflecting structures 12, which are arranged on the underside of a mask 14, onto a light-sensitive layer 16. The light-sensitive layer 16, which can, in particular, be a resist, is supported by a wafer 18 or another substrate.

The projection exposure apparatus 10 comprises a projection light source PLS, which generates projection light PL and can, for example, be embodied as a laser plasma source. In particular, a range between 5 nm and 30 nm can be used as wavelength for the projection light PL. In the illustrated present exemplary embodiment, the mean wavelength of the projection light PL is approximately 13.5 nm and therefore lies in the extreme ultraviolet spectral range (EUV).

A projection-light illumination system 20 directs the projection light PL onto the side of the mask 14 provided with the structures 12. Here, the projection light PL illuminates an illumination field 24 on the underside of the mask 14, which illumination field has the geometry of an annular segment in the illustrated exemplary embodiment.

The projection exposure apparatus 10 furthermore includes a projection lens 26, which, on the light-sensitive layer 16, generates a reduced image 24' of the structures 12 situated in the region of the illumination field 24. OA denotes the optical axis of the projection lens 26, which coincides with the axis of symmetry of the annular segment-shaped illumination field 24. However, the disclosure can also be used in those projection exposure apparatuses in which there are no rotationally symmetric cut-out areas in the projection lens 26 and therefore no optical axis has been defined.

The projection lens 26 is designed for scanning operation, during which the mask 14 is displaced synchronously with the wafer 18 during the exposure of the light-sensitive layer 16. These displacement movements of the mask 14 and of the wafer 18 are indicated by arrows A1 and A2, respectively, in FIG. 1. The ratio of the speeds with which the mask 14 and the wafer 18 are displaced in this case equals the imaging scale β of the projection lens 26. In the illustrated exemplary embodiment, the image 24' generated by the projection lens 20 is reduced in size (|β|<1) and the right way up (β>0), which is why the wafer 18 is displaced more slowly than the mask 14, but along the same direction. Hence, the illumination field 24 passes over the mask 14 in a scanner-like fashion during an exposure of the light-sensitive layer 16, as a result of which larger, contiguous structure regions can also be projected onto the light-sensitive layer 16.

Light beams which enter the projection lens 26 originate from each point in the illumination field 24, which is situated in an object plane of the projection lens 26. The effect of this is that the entering light beams converge on field points in an image plane behind the projection lens 26. Here, the field points in the object plane, from which the light beams originate, and the field points in the image plane, in which these light beams reconverge, are related to one another in what is called optical conjugation.

Such a light beam is indicated schematically for a single point in the center of the illumination field 24 and denoted by 28. Here, the opening angle of the light beam 28 when entering the projection lens 10 is a measure of the numerical aperture NA of the latter. As a result of the reduced image, the image-side numerical aperture NA of the projection lens 26 is increased by the reciprocal of the imaging scale β.

Figures 2, 3:
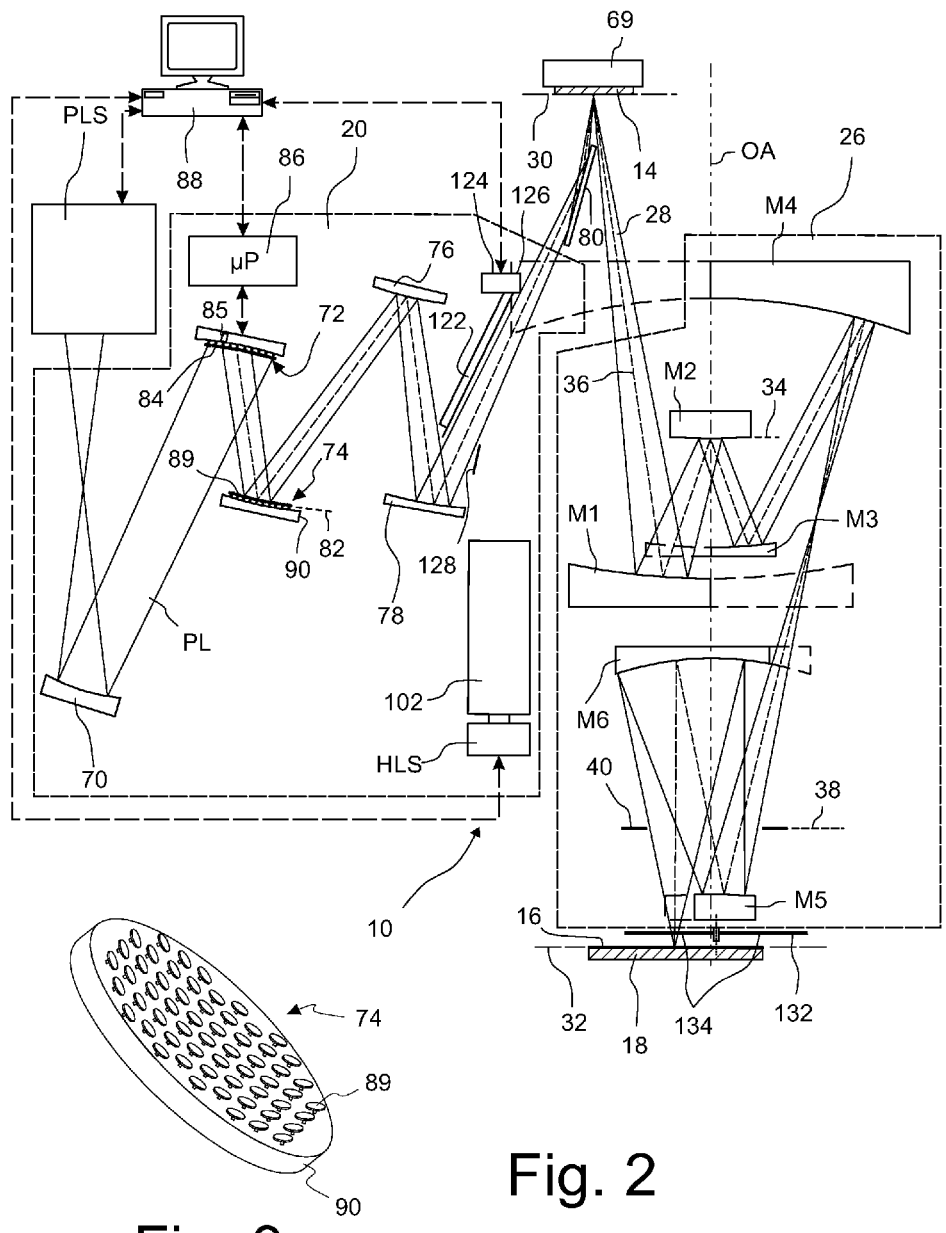
FIG. 2 shows a simplified schematic meridional section through the projection exposure apparatus shown in FIG. 1, during projection operation.
FIG. 3 shows a simplified perspective view of a pupil facet mirror, which is part of an illumination system of the projection exposure apparatus shown in FIGS. 1 and 2.

FIG. 2 shows a schematic meridional section through the projection exposure apparatus 10, in which further details can be identified. A total of six mirrors M1 to M6 are arranged between the object plane, denoted by 30, and the image plane, denoted by 32, of the projection lens 26. The light beam 28 originating from a point in the object plane 30 firstly impinges on a concave first mirror M1, is reflected back onto a convex second mirror M2, impinges on a concave third mirror M3, is reflected back onto a concave fourth mirror M4 and then impinges on a convex fifth mirror M5, which directs the EUV light back onto a concave sixth mirror M6. The latter finally focuses the light beam 28 onto a conjugated image point in the image plane 32.

If the mirrors M1 to M6 were to be supplemented by the parts indicated by a dashed line in FIG. 2, the reflecting areas of the mirrors supplemented thus would be rotationally symmetric with respect to the optical axis OA of the projection lens 26. However, it is easy to identify that the beam path described above could not be realized with such completely rotationally symmetric mirrors because the mirrors M1, M2 and M4 to M6 would then partly block the light path.

The projection lens 26 has a first pupil surface 34, which is situated on or in the direct vicinity of the surface of the second mirror M2. A pupil surface is distinguished by the fact that the chief rays of the light beams originating from points in the object plane 30 cut the optical axis OA at the location. In FIG. 2 this is shown for the chief ray, denoted by 36 and indicated by a dashed line, of the light beam 28.

A second pupil surface 38 is situated in the beam path between the fifth mirror M5 and the sixth mirror M6, wherein the distance between the second pupil surface 38 and these two mirrors M5, M6 is relatively large. An aperture stop 40 is arranged level with the second pupil surface 38.

The projection-light illumination system 20 of the projection exposure apparatus 10 prepares the projection light PL generated by the projection light source PLS and directs it on the mask 14 attached to a mask holder 69 in such a way that every point there within the illumination field 24 is illuminated by projection light PL with the desired intensity and illumination angle distribution. The term illumination angle distribution describes how the whole intensity of a light beam associated with a single field point is distributed amongst the different directions of incidence.

To this end, the projection-light illumination system 20 has an input mirror 70, a field facet mirror 72, a pupil facet mirror 74, a first condenser mirror 76 and a second condenser mirror 78.

Figure 11:
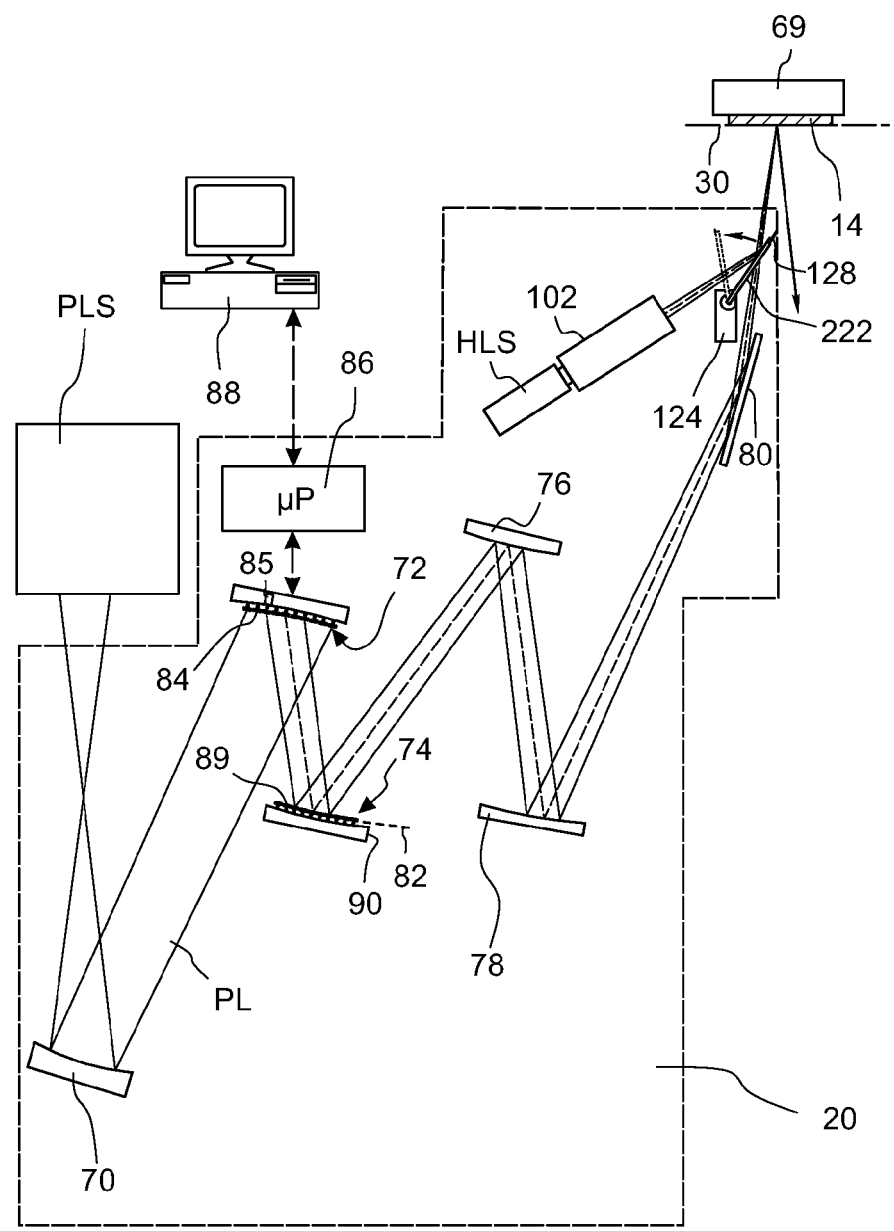
FIG. 11 shows a meridional section through a projection-light illumination system of a projection exposure apparatus according to an exemplary embodiment in which the switching mirror is arranged between a deflection mirror and the mask.

The projection light PL is finally directed at the mask 14 via a mirror 80, which is designed for grazing incidence and which can also be arranged within the projection-light illumination system 20 (cf. FIG. 11).

Here, the pupil facet mirror 74 illustrated in a perspective view in FIG. 3 is arranged on a pupil surface, indicated at 82, of the projection-light illumination system 20. The pupil surface 82 of the projection-light illumination system 20 is optically conjugate to the pupil surfaces 34 and 38 of the projection lens 26. The intensity distribution on the pupil facet mirror 74 of the projection-light illumination system 20 is therefore initially imaged on the second mirror M2 of the projection lens 26 and, from there, on the second pupil surface 38.

Using the field facet mirror 72 it is possible to illuminate the pupil facet mirror 74 in different fashions. To this end, the mirror facets 84 of the field facet mirror 72 can, with the aid of actuators 85, be individually tilted or adjusted in a different manner such that the projection light PL impinging thereon can be directed at different mirror facets of the pupil facet mirror 74. To this end, the actuators 85 of the field facet mirror 72 are actuated by a control unit 86, which is connected to an overarching central control 88 of the projection exposure apparatus 10. The geometry of the illumination field 24 in the object plane 30 is fixed by the external contour of the mirror facets 84 of the field facet mirror 72.

Since the pupil surface 82 of the projection-light illumination system 20 is linked to the object plane 30 by a Fourier transform, the spatial intensity distribution of the pupil surface 82 fixes the illumination angle distribution in the object plane 30. Hence, locations on the pupil surface 82 correspond to angles in the object plane 30. Conversely, angles on the pupil surface 82 correspond to locations in the object plane 30. Hence, by illuminating the pupil facet mirror 74 differently with the aid of the field facet mirror 72 the illumination angle distribution of the projection light incident on the mask 14 can be matched in a targeted fashion to the structures 12 contained in the mask 14.

Projection light should only be incident on the mask in a tightly delimited angular region in the case of some illumination angle distributions. For the illumination of the pupil surface 82 of the projection-light illumination system 20 this means that only relatively small regions there are illuminated by the field facet mirror 72.

Since the pupil surface 82 of the projection-light illumination system 20 is imaged on the first pupil surface 34 of the projection lens 26 by the following optical components, an intensity distribution is created on the surface of the second mirror M2 in which only small regions are likewise illuminated. Moreover, as a result of the raster-like arrangement of the pupil facet mirrors 89, these regions do not have homogeneous illumination but are likewise raster-like. The smaller the regions of the surface of the second mirror M2, which are often also referred to as poles, are, the more inhomogeneous the heat influx is as a result of the partial absorption of the projection light PL.

Figures 4, 5:
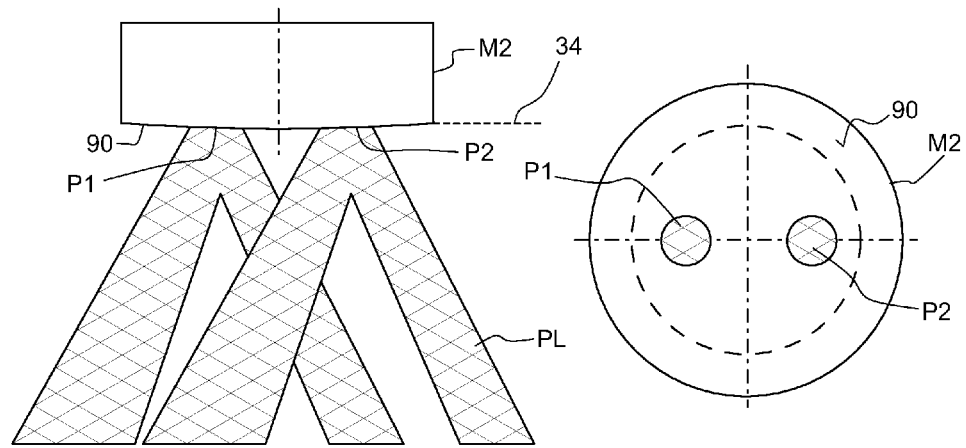
FIG. 4 shows a meridional section through the second mirror of the projection lens shown in FIG. 2, during projection operation.
FIG. 5 shows a plan view of the second mirror during projection operation.

FIGS. 4 and 5 show this using the example of a so-called dipole illumination setting, in which two poles P1, P2 are illuminated by projection light PL on the pupil surfaces of the projection exposure apparatus 10 and hence also on the surface 90 of the second mirror M2. In the meridional section of FIG. 4 through the second mirror M2 and in the plan view of the mirror M2 in FIG. 5, the rasterization of the poles P1, P2, which is caused by the raster-like arrangement of the pupil facet mirrors 89, has not been illustrated for sake of simplicity.

Since approximately one third of the energy-rich projection light is absorbed in the reflecting coating of the mirrors, the heat influx is relatively high in the region of the rastered poles P1, P2. This leads to a change in the temperature distribution in the mirror substrate. It is difficult to avoid deformations in the mirror substrate even if use is made of a mirror substrate which consists of a material with a low thermal expansion coefficient. Since the poles P1, P2 cover a comparatively small area, the resulting temperature distribution has high temperature gradients and, moreover, is not unsymmetrical from a rotational symmetry point of view. The deformations accompanying this are complicated and lead to aberrations which possibly cannot be corrected to a sufficient extent by conventional correction measures such as tilting and displacing mirrors.

2. Heating Light

In order to reduce the temperature gradients in the mirror substrate and/or to symmetrize the temperature distribution, the projection exposure apparatus 10 has a heating light source HLS. As will still be explained in more detail below, the heating light source HLS generates heating light at times at which the light-sensitive layer 16 is not exposed to projection light PL. At these times, the heating light enters the projection lens 26 in such a way that it is incident on regions of the surface of the mirror M2 which are not heated by the projection light PL. As a result of this, the surface of the mirror M2, averaged over time, is heated more uniformly. The aberrations caused by deformations of the mirror substrate can thereby be controlled more easily.

a) Heating Light Source

The heating light source HLS differs from the projection light source PLS and is designed to generate heating light with a mean wavelength that differs from the mean wavelength of the projection light PL. In the illustrated exemplary embodiment, the heating light source HLS is a KrF excimer laser, which generates heating light with a wavelength of 248 nm.

So that the heating light during the heating operation at least also impinges on regions on the mirror M2 which are not exposed to the projection light PL during the projection operation, the heating light, in the object plane 30 of the projection lens 26, has an angle distribution, the Fourier transformed of which on the first pupil surface 34 of the projection lens 26 corresponds to the desired local intensity distribution. In order to generate such an illumination angle distribution in the object plane 30, a heating-light illumination system 102 is connected downstream of the heating light source HLS.

b) Heating-Light Illumination System

Figure 6:
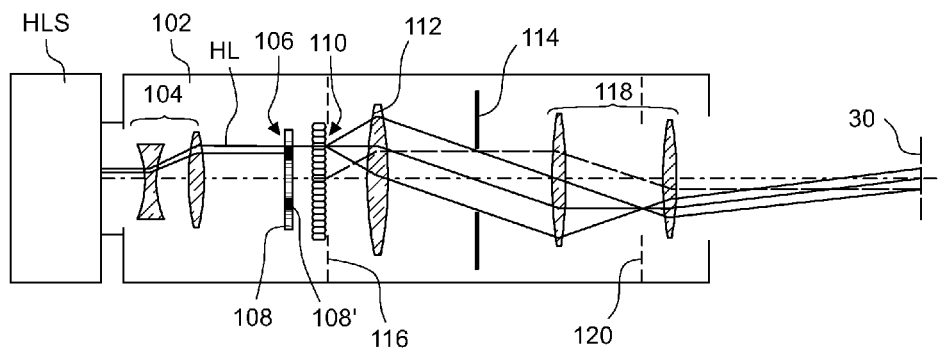
FIG. 6 shows a meridional section through a heating-light illumination system, which is part of the projection exposure apparatus shown in FIGS. 1 and 2.

The basic design of the heating-light illumination system 102 is shown in FIG. 6 in a schematic meridional section. The heating-light illumination system 102 includes a beam expander 104 which, for example, can include an arrangement of mirrors or, as shown in FIG. 6, an arrangement of scattering and collecting lenses. Arranged behind the beam expander 104 there is an LCD matrix 106, which includes a multiplicity of, e.g. 101×101, LCD elements 108, which are arranged in regular fashion to form a matrix. By applying an electric current, each LCD element 108 can be switched between a first state, in which the LCD element 108 is transparent to the heating light, and a second state, in which it is opaque to the heating light. LCD elements in the second opaque state are colored black in FIG. 6 and denoted by 108'.

As seen in the direction of ray propagation, a fly's eye lens 110, a condenser 112, which is indicated by a single lens only in this case, and an adjustable field stop 114 are arranged behind the LCD matrix 106. The front focal plane of the condenser 112 constitutes a first pupil surface 116 of the heating-light illumination system 102.

The rear focal plane of the condenser 112 forms a field plane in which the field stop 114 is arranged. During the heating operation, the field stop 114 is imaged on the object plane 30 of the projection lens 26 with the aid of a subsequent lens 118 and, optionally, further optical components (of the mirror 80 in this case) of the projection exposure apparatus 10.

The spatial intensity distribution on the first pupil surface 116, and hence the illumination angle distribution in the object plane 30, can be set as desired within wide boundaries with the aid of the electrically actuatable LCD matrix 106. Naturally, the LCD matrix 106 can also be arranged on a second pupil surface 120, which is situated in the lens 118. Furthermore, other components can be used in place of the LCD matrix 106. In particular, it is possible, like in VUV illumination systems, to use interchangeable diffractive optical elements or micromirror arrangements, by which the first pupil surface 116 can be illuminated in a variable fashion.

Moreover, it is possible to dispense with the fly's eye lens 110, which serves firstly to homogenize the heating light and secondly to set the field region illuminated in the rear focal plane of the condenser 112.

c) Switching Mirror

In order to be able to couple the heating light generated by the heating light source HLS into the projection lens 26, the projection exposure apparatus shown in FIG. 2 has a switching mirror 122 which, just like the heating light source HLS and the heating-light illumination system 102, is arranged within the projection-light illumination system 20 in the illustrated exemplary embodiment. During the projection operation, shown in FIG. 2, of the projection exposure apparatus 10, the switching mirror 122 is situated in a first position, in which only the projection light PL can impinge on the mask 14 and enter the projection lens 26 from there.

Figure 7:
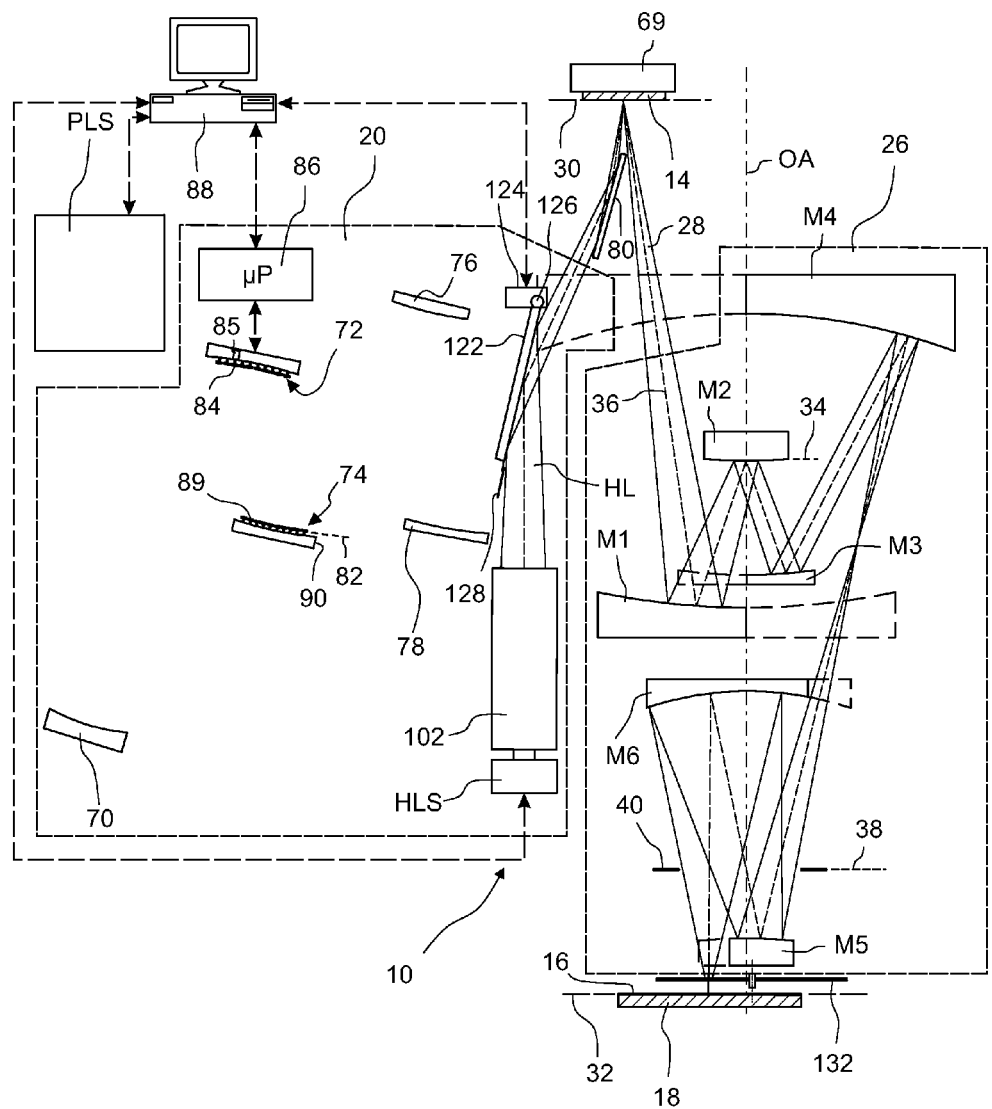
FIG. 7 shows a meridional section through the projection exposure apparatus of FIG. 2, but during the heating operation.

A drive 124 is assigned to the switching mirror 122, by which the switching mirror 122 can be moved from the first position, shown in FIG. 2, to a second position, which is shown in FIG. 7. In this second position of the switching mirror 122, the heating light HL, which is generated by the heating light source HLS and prepared by the heating-light illumination system 102, is reflected by the switching mirror 122 in such a way that it can enter the projection lens 26 after being reflected by the mirror 80 and the mask 14. Hence, only the heating light HL and not the projection light PL can enter the projection lens 26 in the second position of the switching mirror 122.

In the illustrated exemplary embodiment, the switching mirror 122 can with the aid of the drive 124 be pivoted about an axis of rotation 126 which runs perpendicular to the plane of the paper in FIGS. 2 and 7. Naturally, other rotational movements and translational movements of the switching mirror 122 are also feasible for deflecting the beam path toward the heating light source HLS. In order to be able to displace the switching mirror 122 precisely into the second position, provision is made for a stop 128, which fixes the pivot angle of the switching mirror 122 for the second position (cf. FIGS. 2 and 7).

d) Function

Figure 8:
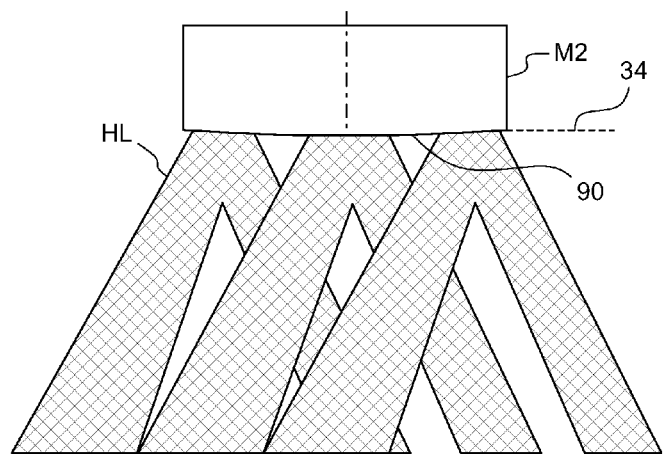
FIG. 8 shows a meridional section corresponding to FIG. 4, through the second mirror during the heating operation.
Figures 9, 10:
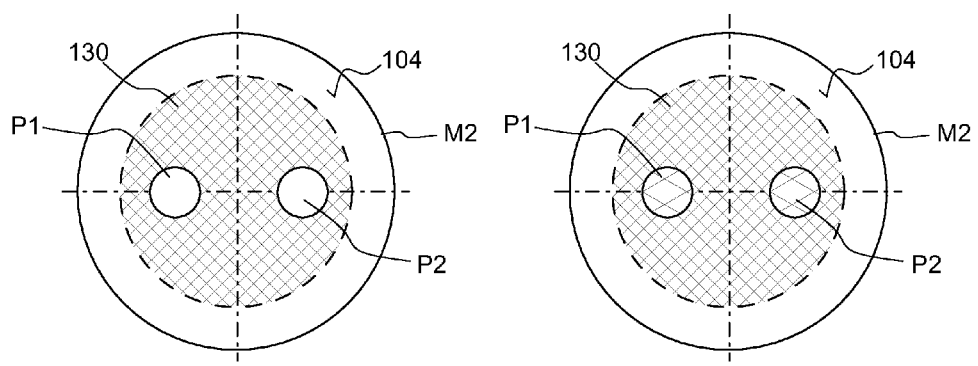
FIG. 9 shows a plan view, corresponding to FIG. 5, of the second mirror during the heating operation.
FIG. 10 shows a plan view of the second mirror, on which both the regions illuminated during the projection operation and the regions illuminated during the heating operation can be identified.

During the heating operation, in which the switching mirror 122 is situated in the second position, which is shown in FIG. 7, the heating light HL illuminates a region on the surface 90 of the second mirror M2, which region at least approximately complements that region that is illuminated by projection light PL during the projection operation. This is shown in FIGS. 8 and 9, which, in accordance with FIGS. 4 and 5, show a meridional section through the second mirror M2 and a plan view of the latter during the heating operation. The circular region 130 illuminated on the surface 90 of the mirror M2 by the heating light HL is indicated by a cross hatch. One can identify that the poles P1, P2 illuminated by the projection light PL during the projection operation are not heated by the heating light HL. As shown in FIG. 10, the region 130 illuminated by the heating light HL is therefore complementary to the poles P1, P2 illuminated by the projection light PL. Over a relatively long period of time, during which projection operation and heating operation alternate, this results in a more homogeneous temperature distribution in the substrate of the second mirror M2 than if only the poles P1, P2 are illuminated by projection light PL. If this temperature is near a temperature at which the substrate of the second mirror M2 has a vanishing thermal expansion coefficient, the remaining temperature variations do not have an effect, or only have a small effect, on the shape of the substrate.

e) Control

The heating operation, during which the switching mirror 122 is situated in the second position, which is shown in FIG. 7, can for example be carried out during time intervals in which the exposed wafer 18 is replaced by a still unexposed wafer. Since these time intervals, which are also referred to as duty cycles, are short compared to the time intervals during which the wafers are exposed, the heat influx during the heating operation should be so high that, averaged over time, the desired more uniform heating of the second mirror M2 occurs. The mean wavelength of the heating light HL should therefore be selected in such a way that a sufficiently high component of the heating light HL is absorbed by the coatings of the mirrors M1 to M6, which are designed for a maximum reflection of the projection light PL.

High heating powers will in many cases be easier to achieve if the mean wavelength of the heating light HL is greater than the mean wavelength of the projection light PL. By way of example, in the case of projection light PL with a mean wavelength of 13.5 nm, use can then be made of excimer lasers as heating light sources HLS, the output power of which is generally significantly higher than that of the projection light source PLS. The higher intensity of the heating light HL on the second mirror M2 is indicated by a tighter cross hatch in FIG. 10.

If the switching mirror 122 can be displaced quickly enough between the first and the second position with the aid of the drive 124, a heating operation is also possible in the substantially shorter exposure breaks which occur between two successive scanning processes. The more often a switch is made to the heating operation (even if only for a brief period of time), the more uniform, averaged over time, the temperature distribution in the substrate of the second mirror M2 will be.

The change between the projection operation and the heating operation is controlled by the central control 88. To this end, the central control 88 is connected via signal lines not only to the projection light source PLS, but also to the heating light source HLS, the heating-light illumination system 102 and the drive 124 for the switching mirror 122, as shown in FIGS. 2 and 7. In the process, the central control 88 inter alia actuates the LCD matrix 106 contained in the heating-light illumination system 102 such that the illumination angle distribution of the heating light HL in the object plane 30 of the projection lens 26 is at least substantially complementary to the illumination angle distribution of the projection light PL in the project plane 30, which distribution is set via the control unit 86 with the aid of the field facet mirror 72. Adjusting the mirror facets 84 of the field facet mirror 72 with the aid of the actuators 85 is therefore generally accompanied by a complementary adjustment of the LCD matrix 106 in the heating-light illumination system 102.

f) Shutter

In order also to be able to carry out a heating operation when a wafer 18 is still situated in the image plane 32 of the projection lens 26, the projection exposure apparatus 10 in this exemplary embodiment has a shutter which is arranged between the last mirror M6 of the projection lens 26 and the image plane 32. In the illustrated exemplary embodiment, the shutter is embodied as perforated disk 132, which has two or more openings 134 for passing projection light PL. In the rotational position of the perforated disk 132 shown in FIG. 2, the projection light PL can pass through one of the openings 134.

During the heating operation, the perforated disk 132 is situated in a rotational position shown in FIG. 7, in which no opening clears the path between the projection lens 26 and the image plane 32. In this rotational position, the heating light HL is absorbed so completely by the perforated disk 132 that no heating light HL, or at least less than 0.5% of the heating light HL generated by the heating light source HLS, can impinge on the light-sensitive layer 26 and contribute to an (albeit small) exposure.

As a result of continuously rotating the perforated disk 132, it is also possible to achieve high shutter frequencies in order to enable a particularly frequent change between projection and heating operation.

3. Further Exemplary Embodiments

In the exemplary embodiment explained above on the basis of FIGS. 1 to 10, the switching mirror 122 is situated in the beam path of the projection light PL between the condenser mirror 78 and the mirror 80.

a) Other Arrangements and Embodiments of the Switching Mirror

FIG. 11 shows an illustration, based on FIG. 2, of an alternative exemplary embodiment for a projection-light illumination system 20. Equivalent or mutually corresponding parts are denoted by the same reference signs and are not described again.

In the projection-light illumination system 20, the switching mirror denoted by 222 is arranged in the beam path of the projection light PL between the deflection mirror 80 and the mask 14. FIG. 11 shows the illumination system 220 during the heating operation, in which the switching mirror 222 is situated in the second position. In this second position, it is only the heating light HL and not the projection light PL that can enter the projection lens after reflection on the mask 14. If the switching mirror 222 is pivoted into the first position, indicated by dashed lines, with the aid of the drive 124 as indicated by an arrow, the switching element 22 opens up the path for the projection light PL and blocks the heating light HL.

FIGS. 12 and 13 show a section from a projection-light illumination system 20 as per a further exemplary embodiment, in the projection operation and heating operation, respectively. Equivalent or mutually corresponding parts are denoted by the same reference signs and are not described again.

In this exemplary embodiment, the switching element denoted by 322 is formed by the mirror which is designed for grazing incidence and denoted by 80 in FIGS. 2 and 7. If the switching mirror 322 is pivoted away into the second position with the aid of the drive 324, as shown in FIG. 13, it is only the heating light HL and not the projection light PL that can enter the projection lens 26 after reflection on the mask 14. Whereas the switching element 122, 222 in the previously described exemplary embodiments does not reflect the projection light in the first position and reflects the projection light in the second position, this situation is reversed in the exemplary embodiments shown in FIGS. 12 and 13.

In contrast to the two exemplary embodiments described above, use in this case is moreover made of a mask 14 that has a region 340 which is embodied as a plane mirror. The plane mirror should reflect at least 90% of the heating light HL and be dimensioned such that it covers all or at least 90% of the object field of the projection lens 26 that can be projected onto the light-sensitive layer 16. This object field is usually slightly larger than the illumination field 24 which is illuminated on the mask 14 by the projection light PL during the projection operation.

During the heating operation, the mask holder 69 is displaced such that the mask 14 to be projected during the projection operation is moved out of the object field and the plane mirror 340 is introduced into the object field instead. This displacement movement is indicated in FIG. 13 by an arrow over the mask holder 69. As a result of positioning the plane mirror 340 in the object field of the projection lens 26, a significantly larger part of the heating light HL is generally coupled into the projection lens 26 than if it were reflected by the mask 14. At the same time, the mask 14 is prevented from unnecessarily being heated up by the heating light HL during the heating operation.

Naturally, this measure can likewise be used in all other exemplary embodiments.

FIGS. 14 and 15 show a section of the projection-light illumination system 20 and the projection lens 26 during the projection operation and the heating operation, respectively, as per a further exemplary embodiment. Equivalent or mutually corresponding parts are denoted by the same reference signs and are not described again.

In this exemplary embodiment, the mask 14 itself forms a switching element for letting either the projection light PL or the heating light HL enter the projection lens 26. During the projection operation, shown in FIG. 14, the mask 14 as is conventional reflects the projection light PL directed onto the mask 14 from the projection-light illumination system 20 such that the projection light enters the projection lens 26.

In the heating operation shown in FIG. 15, a mask displacement table (not illustrated) is used to displace the mask 14 out of the object field of the projection lens 26 to that extent that no projection light PL can enter the projection lens 26 anymore. Instead, the path for heating light HL is cleared in this second position of the mask 14, which heating light is generated by the heating light source HLS and provided with the desired illumination angle distribution by the heating-light illumination system 102. To this end, the heating light source HLS and the heating-light illumination system 102 are arranged on the side of the object plane 30 facing away from the projection-light illumination system 20 in the illustrated exemplary embodiment.

Figure 16:
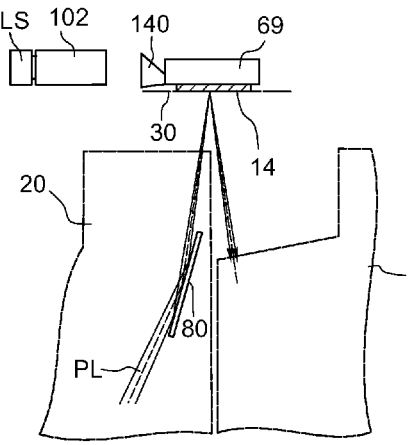
FIGS. 16 and 17 show, in sections, meridional sections through a projection exposure apparatus during the projection operation and the heating operation, respectively, as per a variant of the exemplary embodiment shown in FIGS. 14 and 15, in which a switching element is formed together by the mask and a deflection prism.
Figure 17:
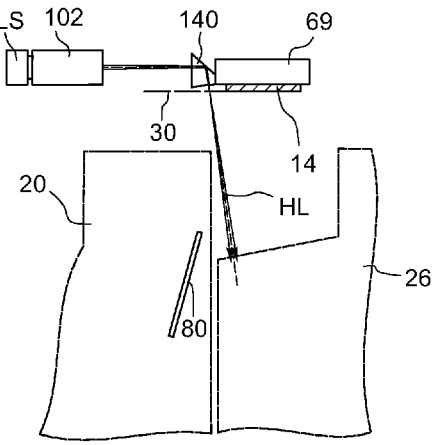

FIGS. 16 and 17 show a variant of the arrangement shown in FIGS. 14 and 15 during the projection operation and the heating operation, respectively. Equivalent or mutually corresponding parts are denoted by the same reference signs and are not described again.

In this variant, a deflection prism 140 is attached to the mask holder 69, which deflection prism in the heating operation (FIG. 17) directs the heating light HL onto the projection lens 26 such that it can enter there and heat the mirrors, which are contained therein, at the desired regions. The mask 14 and the deflection prism 140 therefore together form a deflection element for being able to switch between the projection operation and the heating operation.

As a result of providing the deflection prism 140, the heating light source HLS and the heating-light illumination system 102 can be arranged under better utilization of the available installation space.

b) Heating of Mirrors Arranged Near the Field

In the projection lens shown in FIGS. 2 and 7, none of the six mirrors M1 to M6 is situated in the direct vicinity of a field plane, i.e. the object plane 30, the image plane 32 or the intermediate image plane between mirrors M4 and M5. However, there are also designs of catoptric projection lenses in which a mirror is situated in the direct vicinity of a field plane, to be precise of an intermediate image plane in particular. It follows that an image which is more or less in focus of the mask 14 is created on such mirrors arranged near the field.

In specific masks 14, the reflecting structures are distributed so non-uniformly that the heat influx as a result of absorption of the projection light is also very inhomogeneous in the case of mirrors arranged near the field. Just like in the mirrors arranged near the pupils, deformations can be created as a result thereof, the effects of which on the imaging quality can only be controlled with difficulty by other correction measures.

Figure 18:
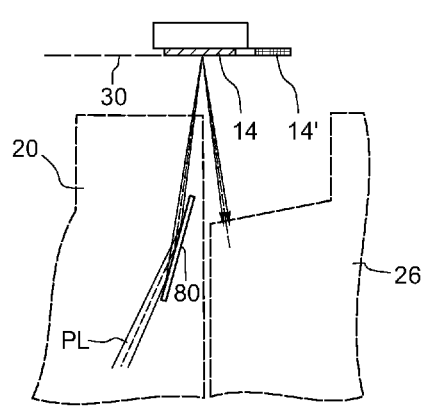
FIGS. 18 and 19 show, in sections, meridional sections through a projection exposure apparatus during the projection operation and the heating operation, respectively, as per a further exemplary embodiment in which the mask likewise forms a switching element and a first mask is imaged during the projection operation and a second mask is imaged during the heating operation.
Figure 19:
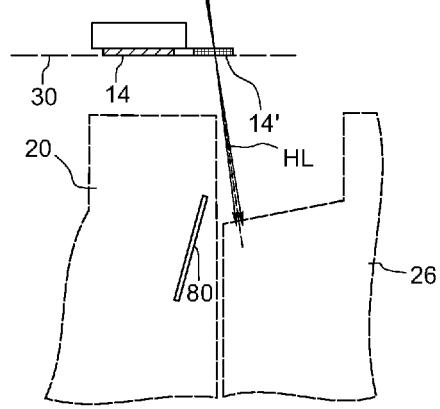

FIGS. 18 and 19 show sections, corresponding to FIGS. 16 and 17, of the projection-light illumination system 20 and the projection lens 26 as per a further exemplary embodiment. Equivalent or mutually corresponding parts are denoted by the same reference signs and are not described again.

In this exemplary embodiment, a second mask 14' is imaged by the heating light HL during the heating operation, which second mask differs from the mask 14 which is imaged during the projection operation. The mask 14' is configured such that it generates an image during stationary imaging (i.e. without a displacement movement of the mask 14' along the scanning direction) that at least substantially complements the image of the mask 14 in the image plane 32, which image is created there during the scanning process.

This will be explained in the following text with reference to FIGS. 20 and 21. FIG. 20 illustrates, in an exemplary fashion, the image 136 of the mask 14, which image is created during a whole scanning process in the image plane 32 during the projection operation. Here the scanning process is indicated by the image 24' of the illumination field 24 and by an arrow. The white spots 141 represent the regions on the image 136 illuminated by the projection light PL. It is possible to identify that projection light only impinges on the image plane 32 within two narrow regions near the short transverse sides of the image field 24'. In general, the structures 12 on the mask 14 are arranged slightly differently than in the image 136 because in the design of the masks specific imaging properties such as the finite resolution capability, which is restricted by diffraction, of the projection lens 26 are already taken into account.

In a schematic plan view, FIG. 22 shows a mirror M arranged near the field, with the image 24" of the illumination field 24 being indicated on the mirror M by a dashed line. During the projection operation, it is only the strips 142a, 142b near the two narrow sides of the image 24" that are illuminated on the mirror M. This leads to a very inhomogeneous illumination of the mirror M and hence to correspondingly high temperature gradients. This can result in the difficult-to-control aberrations, as explained above.

FIG. 21 shows the hypothetical image 138 which would be created in the image plane 32 during stationary projection of the mask 14' during the heating operation if the perforated disk 132 is in the open position. The mask 14' is configured such that the image 138 thereof is at least approximately complementary to the scan-integrated image 136 of the mask 14. As shown in FIG. 23, a region 142 on the surface of the mirror M is accordingly illuminated by the heating light HL during the heating operation, which region, within the image 24" of the illumination field, is likewise complementary to the region 142a, 142b which are illuminated on the mirror M during the projection operation. As a result of this, a similar homogenization of the temperature distribution is achieved, averaged over time, as explained further above with reference to the mirror M2 arranged near the pupil.

Since the heating light HL has a longer mean wavelength than the projection light PL, the second mask 14' can be operated projected on the light-sensitive layer 16 in transmission. As a result, this exemplary embodiment also enables an arrangement of the heating light source HLS and the heating-light illumination system 102 on the side of the object plane 30 facing away from the projection-light illumination system 20, as shown by FIGS. 18 and 19. Moreover, the mask 14 itself also constitutes the switching element in this exemplary embodiment, which switching element is displaced during each change between projection operation and heating operation.

Naturally, the projection of another mask 14' by the heating light HL can also be carried out in the other exemplary embodiments. Optionally, the other mask 14' should then be projected onto the light-sensitive layer 16 not in transmission but in reflection.

c) Forgoing a Heating-Light Illumination System

Figure 24:
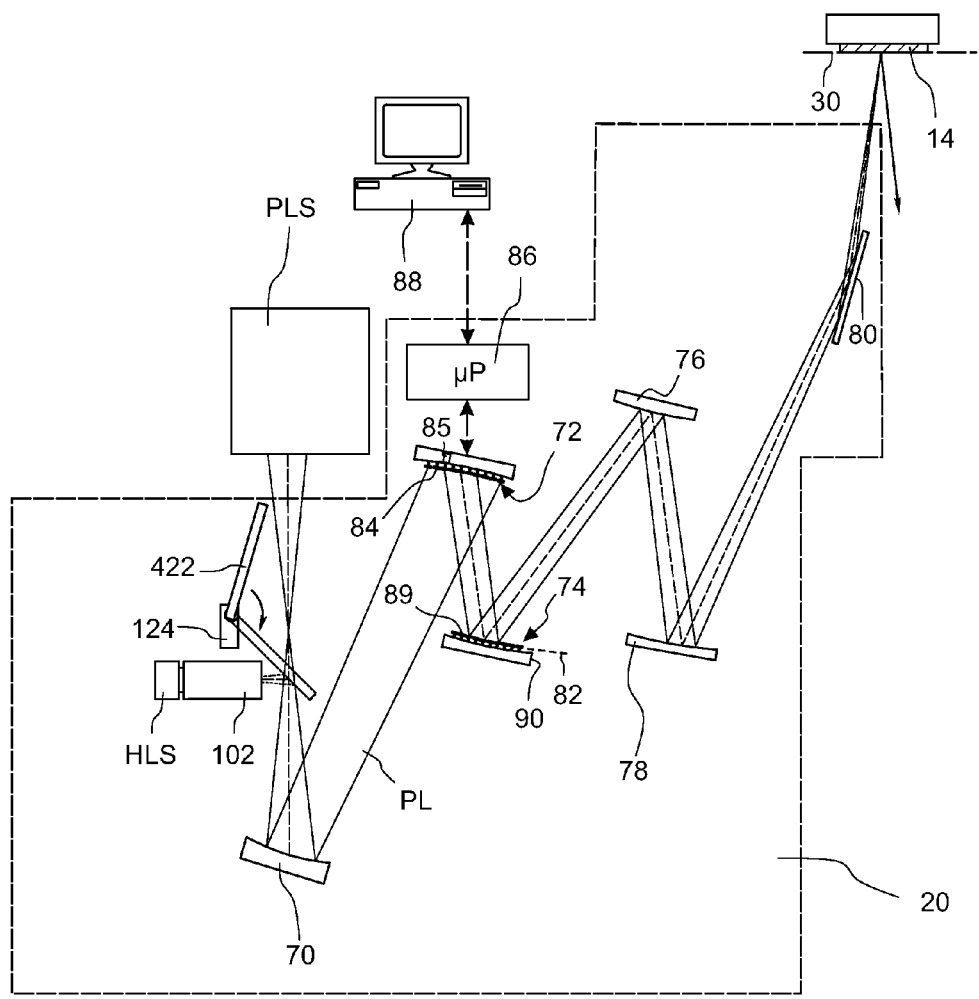
FIG. 24 shows a meridional section through a projection exposure apparatus as per an exemplary embodiment in which heating light can be coupled into the projection-light illumination system with the aid of a switching mirror.

FIG. 24 shows a schematic meridional section of a projection-light illumination system 20 as per a further exemplary embodiment. Equivalent or mutually corresponding parts are denoted by the same reference signs and are not described again.

In this exemplary embodiment, the switching mirror denoted by 422 is arranged between the projection light source PLS and the input mirror 70 of the projection-light illumination system 20. Hence, during the heating operation, the heating light HL is directly coupled into the projection-light illumination system 20 and therefore propagates through the projection-light illumination system 20 just like the projection light PL during the projection operation.

If variably adjustable regions on mirrors arranged near the pupil should be heated by heating light, the projection exposure apparatus contains a heating-light illumination system 102 because the illumination angle distribution in general cannot be modified in the heating light source HLS.

However, in the exemplary embodiment illustrated in FIG. 24, it is possible to dispense with an independent heating-light illumination system because the desired illumination angle distribution in the object plane 30 is applied to the heating light HL with the aid of the projection-light illumination system 20, which is actually provided for the projection light PL. Thus, during a change between the projection operation and the heating operation, the switching mirror 422 is transferred from the first position, illustrated in FIG. 24 with full lines, into the second position, indicated by dashed lines. Before the heating light source HLS is switched on, the mirror facets 84 of the field facet mirror 72 are adjusted with the aid of the actuators 85 such that the desired intensity distribution and hence the desired illumination angle distribution in the mask plane 30 are created on the pupil facet mirror 74. As explained above, the desired intensity distribution can be an intensity distribution in particular, which is substantially complementary to that intensity distribution which is generated in the pupil plane 82 of the projection-light illumination system 20 during the projection operation.

In the case of a converse change from the heating operation to the projection operation, the adjustment processes explained above are lifted again.

d) Filter Element

FIG. 25 shows a section of the projection lens 26, in which a filter element 150 has been arranged between the sixth mirror M6 and the light-sensitive layer 16 in place of the perforated disk 132. The filter element 150 is transparent to the projection light PL and opaque to the heating light. Such filters are described in U.S. Pat. No. 7,372,623 B2, the disclosure of which in this respect is referred to. Just like the perforated disk 132, the filter element 150 ensures that no heating light HL impinges on the light-sensitive layer 16 during the heating operation and possibly contributes to the exposure at the position.

4. Important Method Steps

Figure 26:
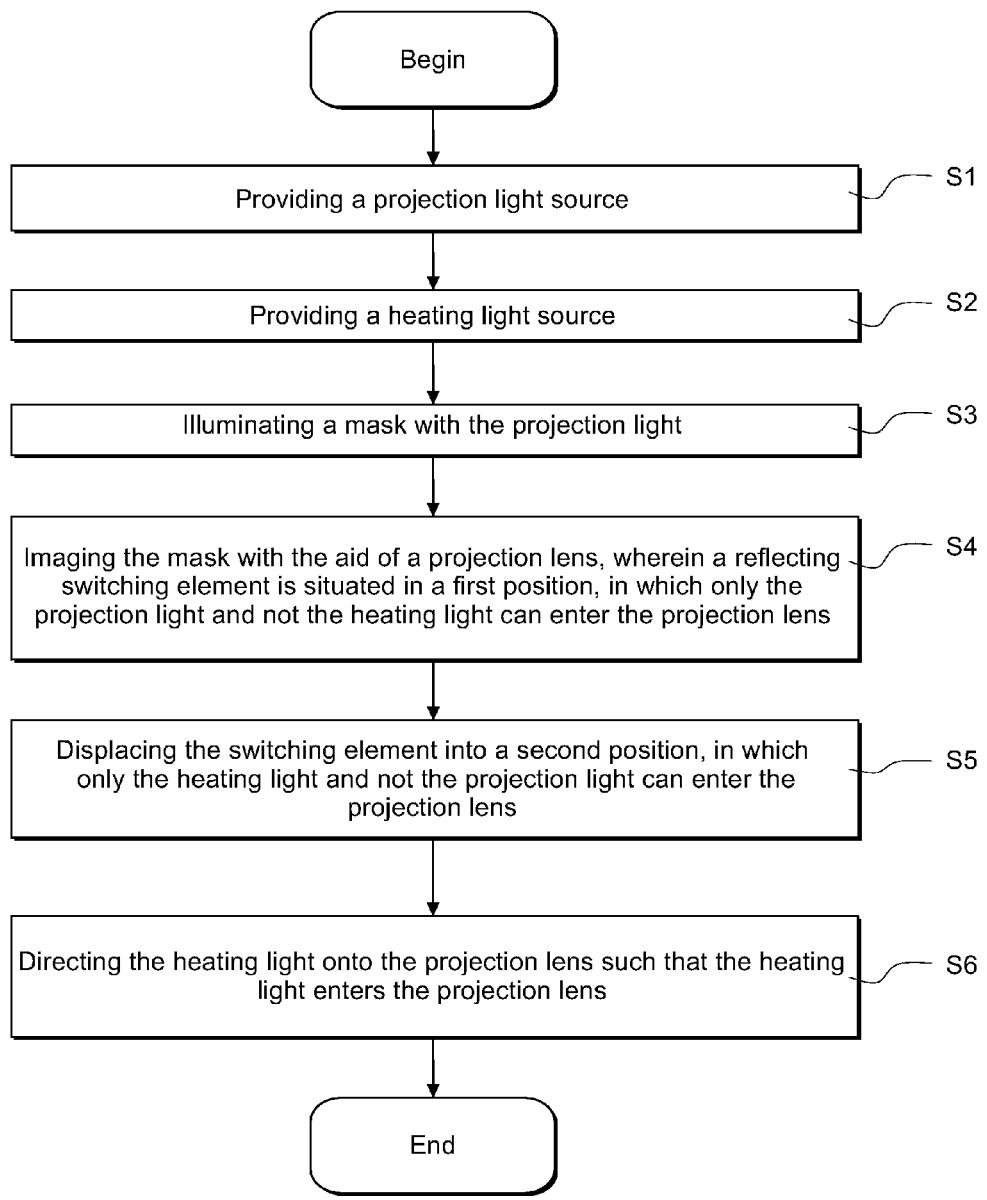
FIG. 26 a flowchart for explaining important steps of a method according to the disclosure.

In the following text, important steps of a method according to the disclosure for operating a microlithographic projection exposure apparatus are summarized with reference to FIG. 26.

A projection light source is provided in a first step S1.

A heating light source is provided in a second step S2.

A mask is illuminated by projection light in a third step S3.

The mask is imaged using a projection lens in a fourth step S4, wherein a reflecting switching element is situated in a first position, in which only the projection light and not heating light can enter the projection lens.

In a fifth step S5, the switching element is displaced into a second position in which only the heating light and not the projection light can enter the projection lens.

In a sixth step S6, the heating light is directed at the projection lens in such a way that the heating light enters the projection lens.

5. Aspects of the disclosure

The disclosure includes the following aspects (formulations):

1. Microlithographic projection exposure apparatus for imaging a reflecting mask (14) onto a layer (16), having:
   a) a projection light source (PLS), which is configured to generate projection light (PL) having a first mean wavelength,
   b) a heating light source (HLS), which differs from the projection light source (PLS) and is configured to generate heating light (HL) having a second mean wavelength that differs from the first mean wavelength,
   c) a catoptric projection lens (26) with a plurality of imaging mirrors (M1 to M6), the projection lens (26) having an object plane (30), in which the mask (14) can be arranged, and an image plane (32), in which the layer (16) can be arranged,
   d) a reflecting switching element (122; 222; 322; 422; 14; 14, 140),
   e) a drive (124), which is configured to displace the switching element (122; 222; 322; 422; 14; 14, 140) between a first position and a second position, wherein only the projection light (PL) can enter the projection lens (26) in the first position of the switching element and only the heating light (HL) can enter the projection lens in the second position of the switching element.

2. Projection exposure apparatus according to formulation 1, wherein the projection exposure apparatus comprises a catoptric projection-light illumination system (20), which is configured to direct projection light (PL) generated by the projection light source (PLS) onto the mask (14) when the switching element (122; 222; 322; 14; 14, 140) is situated in the first position.

3. Projection exposure apparatus according to formulation 2, wherein the switching element (422) is arranged between the projection light source (PLS) and the projection-light illumination system (20) such that the heating light (HL) completely passes through the projection-light illumination system (20) prior to entering the projection lens (26).

4. Projection exposure apparatus according to formulation 2, wherein the switching element (322) is arranged between the projection light source (PLS) and the projection-light illumination system (20) such that the heating light (HL) partly passes through the projection-light illumination system (20) prior to entering the projection lens (26).

5. Projection exposure apparatus according to formulation 4, wherein the projection-light illumination system contains a plurality of illumination mirrors (70, 72, 74, 76, 78, 80) and the switching element (322) is one of the illumination mirrors.

6. Projection exposure apparatus according to formulation 2, wherein the switching element (222; 322; 14; 14, 140) is arranged between the illumination system (20) and the projection lens (26) such that the heating light (HL) enters the projection lens (26) without having previously passed through the projection-light illumination system (20).

7. Projection exposure apparatus according to formulation 6, wherein the switching element is the mask (14), which, in the second position, is arranged such that the heating light (HL) directly enters the projection lens (26) without reflection on the mask (14).

8. Projection exposure apparatus according to formulation 6, wherein the switching element is formed by the mask (14) and a deflection element (140), wherein, in the second position, the mask (14) and the deflection element (140) are arranged such that the heating light (HL) enters the projection lens (26) without reflection on the mask (14) but after reflection on the deflection element (140).

9. Projection exposure apparatus according to one of formulations 4 to 8, wherein the projection exposure apparatus (10) comprises a heating-light illumination system (20), which has an adjustment device (106) that is configured to change an illumination angle distribution which the heating light (HL) has in the object plane (30) of the projection lens (26).

10. Projection exposure apparatus according to one of the preceding formulations, wherein the projection exposure apparatus has a control unit (88), which controls the projection light source (PLS), the heating light source (HLS) and the switching element (122; 222; 322; 14; 14, 140).

11. Projection exposure apparatus according to formulation 10, wherein the control unit (88) controls the projection light source (PLS), the heating light source (HLS) and the switching element (122; 222; 322; 14; 14, 140) such that heating light (HL) can only enter the projection lens (26) during time intervals during which a substrate (18), which carries the layer (16), is being replaced by another substrate.

12. Projection exposure apparatus according to formulation 10 or 11, wherein the control unit (88) controls the projection light source (PLS), the heating light source (HLS) and the switching element (122; 222; 322; 14; 14, 140) such that heating light (HL) is only incident on regions (130; 142) on the imaging mirrors (M1 to M6) on which no projection light (PL) was incident during a preceding projection operation.

13. Projection exposure apparatus according to one of the preceding formulations, wherein a shutter (132) is arranged in the projection lens (26) or between the projection lens (26) and the layer (16), which shutter absorbs or reflects the heating light (HL) in a closed position to such a complete extent that no heating light (HL) can impinge on the layer (16).

14. Projection exposure apparatus according to one of the preceding formulations, wherein a filter element (150) is arranged in the projection lens (26) or between the projection lens (26) and the layer (16), which filter element is transparent to the projection light (PL) and opaque to the heating light (HL).

15. Projection exposure apparatus according to one of the preceding formulations, wherein the second mean wavelength is greater than the first mean wavelength.

16. Projection exposure apparatus according to formulation 15, wherein the first mean wavelength is less than 50 nm and the second mean wavelength is greater than 150 nm.
17. Projection exposure apparatus according to formulation 16, wherein the first mean wavelength is less than 20 nm and the second mean wavelength is greater than 200 nm.
18. Method for operating a microlithographic projection exposure apparatus, comprising the following steps:
    a) providing a projection light source (PLS), which is configured to generate projection light (PL);
    b) providing a heating light source (HLS), which differs from the projection light source (PLS) and is configured to generate heating light (HL), which differs from the projection light (PL);
    c) illuminating a mask (14) with the projection light (PL);
    d) imaging the mask (14) on a layer (16) with the aid of a catoptric projection lens (26) containing a plurality of imaging mirrors (M1 to M6), wherein a reflecting switching element (122; 222; 322; 14; 14, 140) is situated in a first position, in which only the projection light (PL) and not the heating light (HL) can enter the projection lens (26);
    e) displacing the switching element (122; 222; 322; 14; 14, 140) into a second position, in which only the heating light (HL) and not the projection light (PL) can enter the projection lens (26);
    f) directing the heating light (HL) onto the projection lens (26) such that the heating light (HL) enters the projection lens (26).
19. Method according to formulation 18, wherein the heating light (HL) enters the projection lens (26) during time intervals in which a substrate (18), which carries the layer (16), is being replaced by another substrate (18).
20. Method according to formulation 18 or 19, wherein the mask (14) is displaced within a scanning process during step d), and wherein the heating light (HL) enters the projection lens (16) between two successive scanning processes.
21. Method according to one of formulations 18 to 20, wherein the heating light (HL) only impinges on regions (130; 142) on the imaging mirrors (M1 to M6) on which no projection light (PL) impinged during step d).
22. Method according to one of formulations 18 to 21, wherein the illumination angle distribution of the heating light (HL) in the object plane (30) of the projection lens (26) is adapted to the illumination angle distribution of the projection light (PL) in the object plane (30) of the projection lens (26).
23. Method according to formulation 22, wherein the illumination angle distribution of the heating light (HL) in the object plane (30) of the projection lens (26) is adapted such that it is at least substantially complementary to the illumination angle distribution of the projection light (PL) in the object plane (30) of the projection lens (26).
24. Method according to one of formulations 18 to 23, wherein a second mask (14') is imaged during step f), the second mask differing from the mask (14) which is imaged during step d).
25. Method according to formulation 24, wherein the second mask has a region (340) with an area, at least 90% of which reflects at least 90% of the heating light (HL), and wherein the region (340) covers the whole object field of the projection lens (26) that can be projected onto the layer.
26. Method according to one of formulations 18 to 25, wherein the switching element (322; 14) reflects the projection light (PL) in the first position and does not reflect the projection light (PL) in the second position.
27. Method according to one of formulations 18 to 25, wherein the switching element (122; 222) does not reflect the projection light (PL) in the first position and reflects the projection light (PL) in the second position.
28. Method according to one of formulations 18 to 27, wherein the heating light (HL) is directed onto the projection lens (26) such that it also impinges on a last imaging mirror (M6) on the image side of the projection lens (26).
29. Method according to one of formulations 18 to 28, wherein the use of a filter element (150) or a shutter (132) prevents heating light (HL) from impinging on the layer (16).
30. Method according to formulation 29, wherein heating light (HL) is only directed onto the projection lens (26) when the shutter (132) prevents heating light (HL) from impinging on the layer (16).

What is claimed is:
1. An apparatus, comprising:
a projection light source configured to generate projection light having a first mean wavelength;
a heating light source different from the projection light source, the heating light source configured to generate heating light having a second mean wavelength different from the first mean wavelength;
a catoptric projection lens comprising a plurality of imaging mirrors, the catoptric projection lens having an object plane and an image plane;
a switching element; and
a drive configured to displace the switching element between first and second positions,
wherein:
    during use of the apparatus when the switching element is in the first position, the projection light enters the catoptric projection lens but the heating light does not enter the catoptric projection lens;
    during use of the apparatus when the switching element is in the second position, the heating light enters the catoptric projection lens but the projection light does not enter the catoptric projection lens;
    the apparatus is configured to image an object in the object plane into the image plane; and
    the apparatus is a microlithographic projection exposure apparatus.
2. The apparatus of claim 1, further comprising a heating light illumination system which comprises an adjustment device configured to change an angle distribution of the heating light in the object plane of the catoptric projection lens.
3. The apparatus of claim 1, further comprising a control unit configured to control the projection light source, the heating light source and the switching element so that, during use of the apparatus, the heating light enters the projection lens only during time intervals during which an article in the image plane of the catoptric projection objective is being replaced by another object.
4. The apparatus of claim 1, further comprising a shutter, wherein:
    the shutter is in the catoptric projection lens or between the catoptric projection lens and the image plane of the catoptric projection lens; and during use of the apparatus when the shutter is in a closed position, the shutter absorbs or reflects heating light so that less than 5% of the heating light generated by the heating light source impinges on the image plane.

5. The apparatus of claim 1, further comprising a filter element, wherein:
the filter element is in the catoptric projection lens or between the catoptric projection lens and the image plane of the catoptric projection lens;
the filter element is transparent to the projection light; and
the filter element is opaque to the heating light.

6. The apparatus of claim 1, further comprising an illumination system configured to direct the projection light to the object plane of the catoptric projection lens.

7. The apparatus of claim 6, further comprising a mask in the object plane of the catoptric projection lens.

8. The apparatus of claim 7, further comprising a light sensitive layer in the image plane of the catoptric projection lens.

9. The apparatus of claim 1, wherein the first mean wavelength is less than 20 nm.

10. The apparatus of claim 9, wherein the second mean wavelength is greater than 200 nm.

11. A method, comprising:
illuminating a first mask with projection light;
imaging the first mask on a layer via a catoptric projection lens which comprises a plurality of imaging mirrors while a switching element is situated in a first position so that the projection light enters the catoptric projection lens while heating light does not enter the catoptric projection lens, the heating light being different from the projection light; and
moving the switching element into a second position in which the heating light can enter the catoptric projection lens but the projection light does not enter the catoptric projection lens.

12. The method of claim 11, further comprising directing the heating light toward the catoptric projection lens so that the heating light enters the catoptric projection lens.

13. The method of claim 12, wherein the heating light enters the projection lens during time intervals in which a substrate in an image plane of the catoptric projection lens is replaced by another substrate in the image plane of the catoptric projection lens.

14. The method of claim 12, further comprising imaging a second mask while the heating light is directed toward the catoptric projection lens, wherein the second mask is different from the first mask.

15. The method of claim 14, wherein:
the second mask has a region with an area;
at least 90% of the area of the region of the second mask reflects at least 90% of the heating light; and
the region of the area of the mask covers the entire object field of the catoptric projection lens that can be projected onto the layer.

16. The method of claim 12, wherein the heating light is directed toward the catoptric projection lens so that the heating light impinges on a last imaging mirror of the catoptric projection lens on an image side of the catoptric projection lens.

17. The method of claim 11, wherein the first mask is displaced during imaging of the first mask in a scanning process, and the heating light enters the catoptric projection lens between two successive scanning processes.

18. The method of claim 11, wherein the heating light impinges only on regions of the mirrors on which no projection light impinges when the first mask is being imaged.

19. The method of claim 11, further comprising adapting an angle distribution of the heating light in the object plane of the catoptric projection lens to an angle distribution of the projection light in the object plane of the catoptric projection lens.

20. The method of claim 11, further comprising adapting the angle distribution of the heating light in the object plane of the catoptric projection lens to an angle distribution of the projection light in the object plane of the catoptric projection lens so that the angle distribution of the heating light in the object plane of the catoptric projection lens is at least substantially complementary to the angle distribution of the projection light in the object plane of the catoptric projection lens.

* * * * *